CIRCUIT ARRANGEMENT FOR RECEIVING ELECTRICAL SIGNALS

Filed Feb. 28, 1969 2 Sheets-Sheet 1

INVENTORS
GERRIT WOLF
CORNELIS J. M. VAN GILS
BY
[signature]
AGENT

INVENTORS
GERRIT WOLF
CORNELIS J.M.VAN GILS
BY
Frank R. Trifari
AGENT

United States Patent Office 3,559,089 Patented Jan. 26, 1971

3,559,089

CIRCUIT ARRANGEMENT FOR RECEIVING ELECTRICAL SIGNALS

Gerrit Wolf, Nijmegen, and Cornelis Johannes Maria van Gils, Emmasingel, Eindhoven, Netherlands, assignors to U.S. Philips Corporation, New York, N.Y., a corporation of Delaware Filed Feb. 28, 1969, Ser. No. 803,241
Claims priority, application Netherlands, Mar. 9, 1968, 6803411
Int. Cl. H03f 3/04
U.S. Cl. 330—31 2 Claims

ABSTRACT OF THE DISCLOSURE

A circuit arrangement which can be tuned in which signals are applied through a signal-dissipating parallel circuit and subsequently through an inverting impedance network to a transistor arranged in common base configuration so as to obtain both a satisfactory power matching and a satisfactory noise matching. According to the invention tuning is effected by means of a variable capacity diode whose resistive losses at least partly take care of this dissipation in the parallel circuit, while series inductances are provided in order to maintain the bandwidth of the circuit arrangement constant through the tuning range (FIG. 1).

Figure 1:
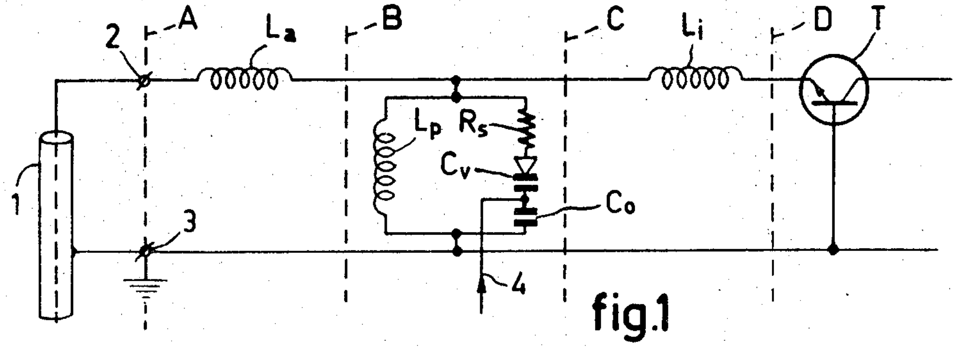

The invention relates to a circuit arrangement for receiving electrical signals which is provided with input terminals for the connection of an input line applying the signals which input terminals are connected through a coupling network to a parallel resonant circuit which can be tuned to the signal frequencies and includes one or more elements dissipating signal power, said parallel resonant circuit being connected through an impedance inverting transformation network to the input of a transistor arranged in common base configuration, the coupling network between the input terminals and the resonant circuit, the inverting transformation network between the resonant circuit and the input of the transistor and the elements dissipating signal power being proportioned in such a manner that substantially optimum power matching is obtained at the input terminals and substantially optimum noise matching is obtained at the input of the transistor.

Such a circuit arrangement is known from Dutch patent application 6,517,121. This known circuit arrangement has a large number of advantageous properties. Since the supply line connected to the input terminal is matched for power in a substantially optimum manner, the applied signal energy is utilised in an optimum manner and troublesome signal reflections are prevented from occurring in the supply line. A circuit arrangement having a very satisfactory signal-to-noise ratio is obtained due to the substantially optimum noise matching of the transistor. As is further described in the above-mentioned application the so-called signal handling capability of the circuit arrangement is advantageous and the circuit arrangement has a satisfactory selectivity.

It is an object of the invention to provide a circuit arrangement which, while maintaining the said advantageous properties, is suitable for tuning by means of a variable capacity diode and in which the pass-band width of the circuit arrangement is substantially constant throughout the tuning range, and to this end the circuit arrangement according to the invention is characterized in that the resonant circuit can be tuned capacitively by means of at least one variable capacity diode, that both the coupling network between the input terminals and the resonant circuit and the inverting transformation network between the resonant circuit and the input of the transistor are mainly formed in known manner by a series inductance and that the signal losses caused by the said elements dissipating signal power are entirely or partially formed by the natural losses of the variable capacity diode.

In order to obtain a constant bandwidth through the tuning range in a resonant circuit tuned capacitively, the overall conductance which occurs parallel across the circuit must be inversely proportional to the square of the tuning frequency. In the circuit arrangement according to the invention use is made of the known fact that the series inductors incorporated between the input terminals and the resonant circuit and between the resonant circuit and the transistor input step up the resistance of the supply line and the input resistance of the transistor, respectively, to conductances which are active across the circuit and which are inversely proportional to the square of the frequency. Furthermore, use is made of the fact that also the natural losses of the variable capacity diode produce a substitution conductance active across the resonant circuit which is inversely proportional to the square of the frequency. The overall conductance across the resonant circuit therefore has the correct frequency dependence which is required for a constant bandwidth throughout the tuning range; since in addition the ratios between these three conductances are independent of the tuning frequency, which ratios determine the power matching at the input terminals and the noise matching at the transistor input, the optimum power matching at the input terminals and the optimum noise matching at the transistor input are maintained throughout the tuning range.

Figure 2:
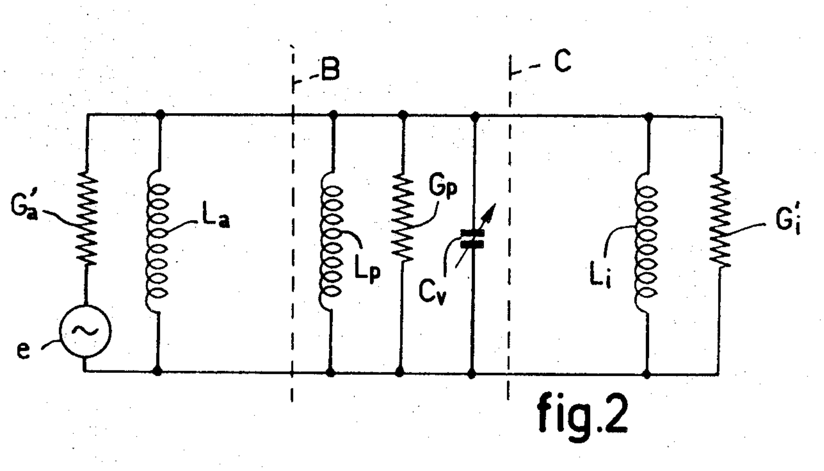
Figure 3:
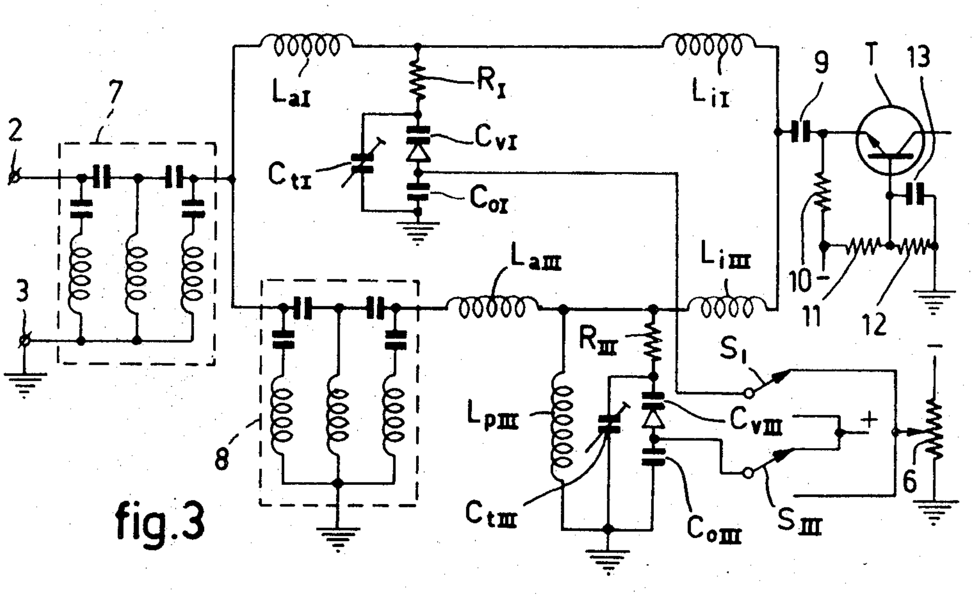
Figure 4:
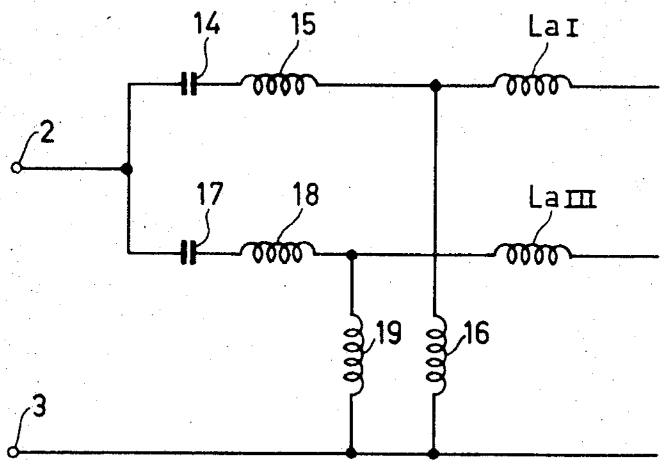

In order that the invention may be readily carried into effect a few embodiments thereof will now be described in detail by way of example with reference to the accompanying diagrammatic drawing, in which:

FIG. 1 shows the principal circuit diagram of a circuit arrangement according to the invention, FIG. 2 shows a substitution daigram to explain the operation of the circuit arrangement of FIG. 1, FIG. 3 shows a further elaborated embodiment of a circuit arrangement according to the invention and FIG. 4 shows a part of another elaborated embodiment of a circuit arrangement according to the invention.

In the principal circuit arrangement of FIG. 1 an asymmetric supply line 1, for example, a co-axial supply cable is connected to the input terminals 2 and 3 of the circuit arrangement. The input terminal 3 is connected to earth. If a supply line, for example, a so-called "twin lead" located symmetrically relative to earth is used, a balun transformer must be incorporated between the supply line and the input terminals by means of which transformer the symmetrical supply line can be connected to the input terminals located asymmerically relative to earth.

The signals of the supply line are applied through a series inductance $L_a$ to a parallel resonant circuit which can be tuned. This circuit mainly consists of an inductance $L_p$ and a variable capacity diode $C_v$. A D.C. voltage by which the capacitance $C_v$ of the variable capacity diode and hence the tuning of the resonant circuit can be varied is applied through a line 4 to the cathode of the variable capacity diode. A capacitor $C_0$ of high value which is connected in series with the variable capacity diode serves to prevent the D.C. voltage applied through the line 4 from flowing to earth. The resistive losses caused by the variable capacity diode are indicated in the principal circuit arrangement of FIG. 1 by a resistor $R_s$ operative in series with the variable capacity diode.

Furthermore, the resonant circuit is connected through a series inductance $L_i$ to the input of a transistor T arranged in common base configuration. The circuit elements which serve for the direct current supply of the transistor T have been omitted in the principal circuit diagram of FIG. 1 for the sake of simplicity.

The input of the transistor T has a conductance $G_i=1/R_i$ for the signal frequencies, wherein $R_i$ represents the input resistance of the transistor. In order that the noise added to the signal by the transistor T is at a minimum the transistor must be connected to a circuit whose conductance $G_s$ has a given value $G_{sopt}$ which is usually considerably lower than the input conductance $G_i$ of the transistor. This means that for an optimum noise matching of the transistor as the input terminal of the transistor (in the cross-section D shown in FIG. 1) a certain mismatching of power must prevail which may be indicated by the standing-wave ratio $$\sigma_i=\frac{G_i}{G_{sopt}}$$

The application referred to in the preamble shows that while using a parallel resonant circuit including elements dissipating signal power and when directly connecting the transistor to the resonant circuit, both optimum power matching at the input terminals 2–3 (the cross-section A of FIG. 1) and optimum noise matching at the transistor input (the cross-section D of FIG. 1) can only be obtained if the optimum source conductance of the transistor $G_{sopt}$ is larger than the input conductance $G_i$ of the transistor. Since in the conventional transistor $G_{sopt}$ is smaller than $G_i$ an impedance inverting transformation network must be incorporated between the resonant circuit and the transistor input. In the circuit arrangement of FIG. 1 this network is mainly formed by the series inductance $L_i$ the impedance of which is considerably larger for the signal frequencies than the input resistance $R_i$ of the transistor.

The admittance on the cross-section C shown in FIG. 1 as viewed in the direction of the transistor is:

$$\frac{1}{R_i+j\omega L_i}=\frac{R_i-j\omega L_i}{R_i^2+\omega^2 L_i^2}$$

wherein $\omega$ is the angular frequency of the signal and $j=\sqrt{-1}$. Since $\omega L_i \gg R_i$ it follows that this admittance is equal to $$\frac{R_i}{\omega^2 L_i^2}+\frac{1}{j\omega L_i}=G'_i+\frac{1}{j\omega L_i}$$

$$\text{Since } G'_i=\frac{R_i}{\omega^2 L_i^2}=\frac{1}{G_i\omega^2 L_i^2}$$

it follows that for the conductance $G_i$ and $G'_i$ at the cross-section D and C as viewed in the direction of the transistor it holds that:

$$G_i G'_i=\frac{1}{\omega^2 L_i^2}$$

It can be shown in a corresponding manner that for the conductances $G_s$ and $G'_s$ at the cross-sections D and C as viewed in the direction of the input terminals 2–3 applies to an approximation that:

$$G_s G'_s=\frac{1}{\omega^2 L_i^2} \text{ so that } G_i G'_i=G_s G'_s \text{ or } \frac{G_i}{G_s}=\frac{G'_s}{G'_i}$$

Due to the inverting transformation of the inductance $L_i$ it is thus achieved that while the transistor input must be connected for optimum noise matching to a conductance $G_{sopt}$ which is smaller than $G_i$, the required conductance $G'_s$ at the cross-section C in the direction of the input terminals must be larger than $G'_i$. While maintaining substantially optimum noise matching at the input terminals 2–3 this can be obtained in a simple manner by providing the resonant circuit with one or more elements dissipating signal power. Since optimum noise matching at the transistor input is obtained if $G_i/G_s=\sigma_i$ and since $$\frac{G_i}{G_s}=\frac{G'_s}{G'_i}$$

this optimum noise matching is obtained if it is ensured that the ratio $G'_s/G'_i$ of the conductance at the cross-section C is equal to the desired value $\sigma_i$.

The admittance $$G'_i+\frac{1}{j\omega L_i}$$

formed by $L_i$ and $R_i$ at the cross-section C as viewed in the direction of the transistor is shown on the right-hand side of the cross-section C in the substitution diagram of FIG. 2 by the parallel arrangement of the inductance $L_i$ and the conductance $G'_i$. The admittance at the cross-section B in the direction of the input terminals 2–3 is shown in a similar manner by the parallel arrangement of an inductance $L_a$ and a conductance $G'_a$ for which it holds that $$G'_a=\frac{R_a}{\omega^2 L_a^2}$$

wherein $R_a$ is the resistance of the supply line. A voltage source $e$ which represents the signal EMF supplied by the supply line is shown in series with $G'_a$.

The resonant circuit shown between the cross-sections B and C in FIG. 1 is represented in the substitution diagram of FIG. 2 by the parallel arrangement of an inductance $L_p$, the capacitance of the variable capacity diode $C_v$ and a conductance $G_p$ which is caused by the resistive losses $R_s$ of the variable capacity diode.

In order to obtain substantially optimum power matching at the input terminal 2–3 the standing-wave ratio $\sigma_a$ at the cross-section B for which it holds that $$\sigma_a=\frac{G'_a}{G_p+G'_i}$$

must be at least approximately equal to 1. In practice it is ensured that $\sigma_a$ is preferably not larger than 2. On the other hand, as shown hereinbefore for optimum noise matching of the transistor, it must hold at the cross-section C that $$\sigma_i=\frac{G'_s}{G'_i}=\frac{G'_a+G_p}{G'_i}$$

in practice $\sigma_i$ may be equal to, for example 9.

It can be derived from these two expressions for $\sigma_a$ and $\sigma_i$ that for obtaining both optimum power matching at the input terminals and optimum noise matching of the transistor the three conductances $G'_a$, $G_p$ and $G'_i$ shown in FIG. 2 must have fixed ratios relative to one another in accordance with $$G'_a : G_p : G'_i = 1 : \frac{1}{\sigma_a}\frac{\sigma_i-\sigma_a}{\sigma_i+1} : \frac{1}{\sigma_a}\frac{\sigma_a+1}{\sigma_i+1}$$

If, for example, $\sigma_a=1$ and $\sigma_i=9$ it follows that $$G'_a:G_p:G'_i=1:0.8:0.2$$

It is desirable that the pass-band width of the circuit arrangement throughout the tuning range is independent of the tuning frequency. For the bandwidth B it applies that:

$$B=\frac{G_{tot}\omega^2 L_{tot}}{2\pi} \quad (2)$$

wherein $G_{tot}$ represents the overall conductance which is present across the resonant circuit ($G_{tot}=G'_a+G_p+G'_i$) and $L_{tot}$ represents the overall circuit inductance which is formed by the parallel arrangement of $L_a$, $L_p$ and $L_i$. It follows from the above equation for the bandwidth that this is only independent of the frequency if $G_{tot}$ is inversely proportional to the square of the tuning frequency $\omega$. Since on the other hand the conductances $G'_a$, $G_p$ and $G'_i$ must have given fixed ratios relative to one another as is shown by Equation 1 for the purpose of correct power matching at the input terminals and for correct noise matching of the transistor, all three conductances $G'_a$, $G_p$ and $G'_i$ must be inversely proportional to the square of the frequency. This is satisfied in a simple manner in the circuit arrangement according to the invention.

As already shown previously it applies for the conductance $G'_i$ that $$G'_i=\frac{R_i}{\omega^2 L^2 i}$$

and since the input resistance $R_i$ of the transistor is substantially independent of the frequency the conductance $G'_i$ is therefore inversely proportional to the square of the frequency. In the circuit arrangement according to the invention the series inductance $L_i$ therefore serves both for the inverting impedance transformation of the input resistance of the transistor already described above and for obtaining the frequency dependence of the transformed conductance $G'_i$ which is required for a constant pass-band width.

For the conductance $G'_a$ there applies that $$G'_a=\frac{R_a}{\omega^2 L^2_a}$$

so that also this conductance has the frequency dependence required for a constant pass-band width.

The conductance $G_p$ originates from the natural losses of the variable capacity diode $C_v$, which losses are shown by the resistance $R_s$ in FIG. 1. The admittance of the variable capacity diode with losses is:

$$\frac{1}{\frac{1}{j\omega C_v}+R_s}=\frac{j\omega C_v}{1+j\omega C_v R_s}=\frac{j\omega C_v+(\omega C_v)^2 R_s}{1+(\omega C_v R_s)^2}$$

Since $\omega C_v R_s$ is $\ll 1$ it follows that the admittance of the variable capacity diode is equal to $$J\omega C_v+(\omega C_v)^2 R_s=j\omega C_v+G_p$$

The variable capacity diode may therefore be represented, as in FIG. 2, by the parallel arrangement of a capacitance $C_v$ and a conductance $G_p$ for which it holds that $$G_p=(\omega C_v)^2 R_s$$

Since furthermore there applies for the resonence frequency $\omega$ that $$\omega^2=\frac{1}{L_{tot}C_v}$$

it follows that $$G_p=\frac{R_s}{\omega^2 L^2_{tot}}$$

wherein $L_{tot}$ is the overall series inductance formed by the parallel arrangement of $L_a$, $L_p$ and $L_i$.

Since the series loss resistance $R_s$ of the variable capacity diode is substantially independent of both the frequency and of the tuning voltage applied across the variable capacity diode, it follows that the parallel conductance $G_p$ caused by the losses of the variable capacity diode across the resonant circuit is to a very satisfactory approximation inversely proportional to the square of the tuning frequency. Since both the conductances $G'_a$ and $G'_i$ and the conductance $G_p$ are inversely proportional to the square of the frequency it is ensured on the one hand in the circuit arrangement according to the invention that the overall conductance which is operative across the resonant circuit has the correct frequency dependence which is required for a passband-width being frequency independent throughout the tuning range, while on the other hand the correct ratios between the three conductances which are given by the Equation 1 and which are required for the correct power matching at the input terminals and the correct noise matching of the transistor are maintained throughout the tuning range.

By filling in the values found for $G'_a$, $G_p$ and $G'_i$ in Equation 1 it is found that:

$$\frac{R_a}{\omega^2 L_a^2}:\frac{R_s}{\omega^2 L^2_{tot}}:\frac{R_i}{\omega^2 L_i^2}=1:\frac{1}{\sigma_a}\frac{\sigma_i-\sigma_a}{\sigma_i+1}:\frac{1}{\sigma_a}\frac{\sigma_a+1}{\sigma_i+1}$$

For $\sigma_a$ is 1 and $\sigma_i$ is 9 it consequently follows that:

$$\frac{R_a}{L_a^2}:\frac{R_s}{L^2_{tot}}:\frac{R_i}{L_i^2}=1:0.8:0.2$$

In practice the resistance $R_a$ of the supply line may be, for example, 75 ohm, the loss resistance of the variable capacity diode may be 1 ohm and the input resistance of the transistor may be 10 ohm so that the above equation changes into $$\frac{75}{L_a^2}:\frac{1}{L^2_{tot}}:\frac{10}{L_i^2}=1:0.8:0.2$$

In this case it is found that $L_a:L_{tot}:L_i=7.75:1:6.32$. Since $L_{tot}$ is formed by the parallel arrangement of $L_a$, $L_p$ and $L_i$ we may further calculate that:

$$L_a:L_p:L_i=7.75:1.4:6.32$$

The value of $L_{tot}$ and hence of all inductances $L_a$, $L_p$ and $L_i$ is given by the tuning range to be covered and by the available variable capacity diode. If, for example, the circuit arrangement is designed for the TV–VFH band III whose highest frequency $$f_{max}=\frac{\omega_{max}}{2\pi}=230 \text{ mc./s.}$$

and if the minimum capacitance $C_{vmin}$ of the variable capacity diode with a possibly parallel arranged tuning capacitor is 5 pF the value of $L_{tot}$ follows from $$L_{tot}=\frac{1}{\omega^2_{max}C_{vmin}}=94.4 \text{ nh.}$$

For the passband width B we find with the aid of Equation 2 that $$B=\frac{(G'_a+G_p+G'_i)\omega^2 L_{tot}}{2\pi}=\left\{\frac{R_a}{L_a^2}+\frac{R_s}{L^2_{tot}}+\frac{R_i}{L_i^2}\right\}\frac{L_{tot}}{2\pi}$$

If the values following from the proportioning referred to above are filled in it is found that the passband width B=4.22 mc./s. For use in a television receiver a bandwidth of approximately 10 mc./s. is usually required to receive the full television signal in the correct manner. In the proportioning referred to above the circuit arrangement according to the invention therefore has too great a selectivity for IV reception. The enlargement of the bandwidth which is necessary in such cases may be obtained by incorporating an additional loss resistor in the circuit arrangement. A necessary condition then is that this additional loss resistor, produces a conductance across the parallel resonant circuit wihch inversely proportional to the square of the tuning frequency. For example, this additional resistor may be incorporated in series with the variable capacity diode $C_v$ or in series with the inductance $L_p$ or in series with the parallel arrangement formed by $C_v$ and $L_p$. The proportioning of the other elements of the circuit arrangement must of course be adapted to the value of this additional resistor and to the manner of its connection.

In the principal circuit arrangement of FIG. 1 it may be advantageous to effect the signal transmission at one or more of the cross-sections A, B, C and D by means of a transformer circuit having magnetically coupled windings. By correct choice of, for example, the transformation ratio a proportioning of the other circuit elements can be obtained which is more advantageous under circumstances. The dispersion inductance of such a transformation circuit may then form at least part of the required series inductance $L_a$ or $L_i$ while also the required parallel inductance $L_p$ can be obtained by such a transformation circuit. Thus it is, for example, possible to connect the ances $L_{aIII}$, $L_{pIII}$ and $L_{iIII}$, a variable capacity diode to a tap of the inductance $L_p$.

A further elaborated embodiment of a circuit arrangement according to the invention is shown in FIG. 3. Since with the existing variable capacity diode it is impossible to cover the entire TV–VHF range, thus both band I and band III, the circuit arrangement shown includes separate circuits for the bands I and III as are shown in FIG. 1 which are connected in parallel relative to each other.

The circuit for tuning in band I includes two series inductances $L_{aI}$ and $L_{iI}$, a variable capacity diode $C_{vI}$ and a direct current blocking capacitor $C_{oI}$, while a trimming capacitor $C_{tI}$ is included parallel across $C_{vI}$ and $C_{oI}$. An additional loss resistor $R_I$ for enlarging the bandwidth is provided in series with the overall tuning capacitance. When proportioning the circuit of band I it appears that the required inductance $L_p$ (see FIG. 1) is very large so that this may be omitted.

The circuit for tuning in band III includes the inductances $L_{aIII}$, $L_{pIII}$ and $L_{iIII}$, a variable capacity diode $C_{vIII}$, a direct current blocking capacitor $C_{oIII}$ and a trimming capacitor $C_{tIII}$. An additional loss resistor $R_{III}$ serves to obtain the required bandwidth upon tuning in band III.

The anode of the variable capacity diode $C_{vI}$ receives a D.C. voltage through a switch $S_I$ and the anode of the variable capacity diode $C_{vIII}$ receives a D.C. voltage through a switch $S_{III}$ coupled to the switch $S_I$. When tuning in band I the switches are in the positions shown. The variable capacity diode $C_{vI}$ is then connected through $S_I$ to the wiper of a tuning potentiometer 6 so that this variable capacity diode receives the required tuning D.C. voltage. Simultaneously the anode of the variable capacity diode $V_{cIII}$ is applied through $S_{III}$ across a positive D.C. voltage so that the diode $V_{cIII}$ is in its pass direction and thus forms a short circuit so that reception in band III is impossible.

For reception in band III the switches $S_I$ and $S_{III}$ are reversed so that the variable capacity diode $V_{cIII}$ receives the tuning D.C. voltage and the variable capacity diode $V_{cI}$ receives the positive D.C. voltage which prevents reception in band I.

The two circuits which serve for tuning in the bands I and III have the character of low-pass filters. To avoid unwanted reception of signals located in lower frequency bands the circuit arrangement includes a high-pass filter 7 connected to the input terminals 2 and 3 which filter only passes the signals located in band I and higher bands. Furthermore, a high-pass filter 8 is included prior to the series inductance $L_{aIII}$ which filter only passes the signals located in band III and higher bands.

The two tuning circuits for the bands I and III are connected through a coupling capacitor 9 to the emitter of the transistor T. For the D.C. adjustment of this transistor a resistor 10 is connected between the emitter and a negative supply voltage, a resistor 11 between the base and the negative supply voltage and a resistor 12 is connected between the base and earth. The base is connected to earth potential for the signal frequencies by means of a capacitor 13 of comparatively high value.

The part of the circuit arrangement of FIG. 3 situated on the left-hand side of $L_{aI}$ and $L_{aIII}$ may advantageously be modified in the manner as shown in FIG. 4. A network comprising a series capacitor 14, a series inductance 15 and a parallel inductance 16 is included in this circuit arrangement between the input terminals 2–3 and the inductance $L_{aI}$. Likewise, a network comprising a series capacitor 17, a series inductance 18 and a parallel inductance 19 is included between the input terminals 2–3 and the inductance $L_{aIII}$.

When correctly proportioning the circuit elements the network 14–15–16 forms a high-pass filter which passes only the signals located in the VHF–I band and higher bands. Also, the resistor $R_a$ of the supply line is stepped down by this network within the VHF–I band independently of the frequency, resulting in the proportioning of the further circuit elements becoming simpler. Similarly, the network 17–18–19 forms a high-pass filter which passes only the signals located in the VHF–III band and higher bands and also steps down the resistor of the supply line within the VHF–III band independently of the frequency.

The circuit elements 14 to 19 are then proportioned, for example, as follows:

$C_{14}$—68 pf.
$L_{15}$—100 $\mu$h.
$L_{16}$—180 $\mu$h.
$C_{17}$—12 pf.
$L_{18}$—69 $\mu$h.
$L_{19}$—24 $\mu$h.

What is claimed is:

1. A circuit arrangement for receiving electrical signals which is provided with input terminals for the connection of an input line applying the signal which input terminals are connected through a coupling network to a parallel resonant circuit which can be tuned to the signal frequencies and includes one or more elements dissipating signal power, said parallel resonant circuit being connected through an impedance inverting transformation network to the input of a transistor arranged in common base configuration the coupling network between the input terminals and the resonant circuit, the inverting transformation network between the resonant circuit and the input of the transistor and the elements dissipating signal power being proportioned in such a manner that substantially optimum power matching is obtained at the input terminals and substantially optimum noise matching is obtained at the input of the transistor, characterized in that the resonant circuit can be tuned capacitively by means of at least one variable capacity diode, that both the coupling network between the input terminals and the resonant circuit and the inverting transformation network between the resonant circuit and the input of the transistor are mainly formed by a series inductance and that the signal losses caused by the said elements dissipating signal power are entirely or partially formed by the natural losses of the variable capacity diode.

2. A circuit arrangement as claimed in claim 1, characterized in that the circuit arrangement includes at least one additional loss resistor which, transformed across the resonant circuit, produces a conductance which is inversely proportional to the square of the frequency.

References Cited

UNITED STATES PATENTS 3,001,146 9/1961 Knol et al. ---------- 330—31

JOHN KOMINSKI, Primary Examiner

U.S. Cl. X.R.

330—24, 176